United States Patent [19]

Schreiber et al.

[11] Patent Number: 5,657,207
[45] Date of Patent: Aug. 12, 1997

[54] ALIGNMENT MEANS FOR INTEGRATED CIRCUIT CHIPS

[75] Inventors: Chris M. Schreiber, Lake Elsinore; Bao Le, Santa Ana, both of Calif.

[73] Assignee: Packard Hughes Interconnect Company, Irvine, Calif.

[21] Appl. No.: 639,805

[22] Filed: Apr. 29, 1996

Related U.S. Application Data

[63] Continuation of Ser. No. 409,248, Mar. 24, 1995, abandoned.

[51] Int. Cl.$^6$ .............................. H05K 1/11; H05K 1/14; H01L 23/544
[52] U.S. Cl. .................... 361/774; 174/254; 174/260; 257/692; 257/797; 361/760; 361/772; 361/776; 439/68
[58] Field of Search ............................. 174/52.1, 52.4, 174/260, 261, 254; 228/180.21, 180.22; 257/690, 692, 723, 724, 678, 797, 737, 746; 361/760, 772, 773, 774, 749, 782, 783, 807, 809, 776; 439/68, 83, 66, 90, 91, 591; 437/209

[56] References Cited

U.S. PATENT DOCUMENTS

| | | | |
|---|---|---|---|
| 3,521,128 | 7/1970 | Oates | 361/760 |
| 3,612,955 | 10/1971 | Butherus et al. | |
| 3,739,232 | 6/1973 | Grossman et al. | |
| 3,811,186 | 5/1974 | Larnerd et al. | 29/626 |
| 3,835,531 | 9/1974 | Luttmer | 29/625 |
| 4,371,912 | 2/1983 | Guzik | |
| 4,435,741 | 3/1984 | Shimizu et al. | |
| 4,565,314 | 1/1986 | Scholz | 228/180.21 |
| 4,878,846 | 11/1989 | Schroeder | 439/65 |
| 4,886,470 | 12/1989 | Billman et al. | 439/266 |
| 4,949,148 | 8/1990 | Bartelink | 257/724 |
| 5,071,363 | 12/1991 | Revlek et al. | 439/291 |
| 5,172,303 | 12/1992 | Bernardoni et al. | |
| 5,207,887 | 5/1993 | Crumly et al. | 205/78 |
| 5,222,293 | 6/1993 | Ozimek et al. | 29/833 |
| 5,306,546 | 4/1994 | Schreiber et al. | 428/210 |

FOREIGN PATENT DOCUMENTS

| | | | |
|---|---|---|---|
| 312217 | 4/1989 | European Pat. Off. | 437/209 |
| 58-125853 | 7/1983 | Japan | 439/68 |
| 4-743 | 1/1992 | Japan | 257/678 |
| 5-82921 | 4/1993 | Japan | 174/261 |

OTHER PUBLICATIONS

IBM Technical Disclosure Bulletin "Chip-to-Pin Carrier Interconnection System", vol. 21 No. 7, Dec. 1978 pp. 2707 and 2708.

*Primary Examiner*—Donald Sparks
*Attorney, Agent, or Firm*—Cary W. Brooks

[57] ABSTRACT

A substrate has a plurality of circuit traces having ends which terminate in raised contacts and an integrated circuit (IC) chip has a plurality of circuit traces terminating in contact ends which engage the raised contacts when the IC chip is positioned onto the substrate. The substrate also has a plurality of raised features thereon which are higher than and spaced from the raised contacts. The raised features have tapered side surfaces for engaging vertically extending surfaces on the IC chip to guide the IC chip into place of the substrate and so that its contact ends are aligned with and engage the raised contacts.

4 Claims, 2 Drawing Sheets

ALIGNMENT MEANS FOR INTEGRATED CIRCUIT CHIPS

This is a continuation of application Ser. No. 08/409248 filed on Mar. 24, 1995 now abandoned.

The present invention relates to an alignment means for aligning or registering an integrated circuit chip to a substrate having raised bumps or contacts, and, more particularly, to providing a substrate having both raised contacts for engaging pads on an integrated circuit chip and having raised features for engaging side surfaces on the integrated circuit chip to guide and align the integrated circuit chip to the raised contacts when the integrated circuit chip is placed into engagement with the raised contacts on the substrate.

Integrated circuit chips are usually formed on larger wafers. The wafers are thereafter either sawed or lased to form discreet square chips or dies or they are scored to define discrete shaped dies and then the dies are broken off from its neighbors along the scored lines. Since sawing off the die is time consuming and relatively expensive, most chip manufacturers use the score and break technique.

Integrated circuit chips or chip carriers are usually connected to electrical contacts on a substrate or interconnection device via wire bonding, soldering or using electrically conducting epoxy adhesive. Many of the integrated circuit chips or dies have a large number of circuit traces thereon which terminate in contact pads for connection with a substrate or interconnection device spaced inwardly from the side edges of the chip. In flip chip or test applications where the chip is flipped over so that it its contact pads face and engage raised contacts or features on a substrate or flex member, it is difficult to properly align the contact pads with the raised features, since the contact pads are essentially hidden from view.

To overcome these alignment problems, manufacturers have used expensive optical machine vision and placement systems. Another method is disclosed in U.S. Pat. No. 4,565,314 which shows aligning integrated circuit packages to a substrate by providing indents in the chip carrier and substrate and by placing a spherical ball in the substrate to register the chip carriers to the substrate. Another method is shown in U.S. Pat. No. 3,811,186 which shows aligning an integrated circuit chip or carrier having raised terminals to mating circuit lands on a substrate by providing a shaped pedestal made from an insulated material on the substrate so that the IC chip terminals straddle the pedestal. Both of these latter alignment methods, however, require additional processing and/or assembly steps during manufacture of the substrate and/or chip carrier.

SUMMARY OF THE INVENTION

The present invention provides a simple and economical alignment means for aligning and registering an IC chip to raised contact bumps or features on a mating interface, be it a final assembly such as a multi chip module substrate or a temporary test device or burn in socket device. The alignment means comprises providing raised guide features or bumps on a substrate which are spaced from, but which are taller than, the raised features or contact bumps for engaging the contact pads on the integrated circuit chips. The raised guide features are tapered and engage vertically extending side surfaces on the flip chip to guide and align the contact pads on the integrated circuit chip so that they engage the raised contact bumps on the substrate. The raised guide features are preferably conical and they can either engage the outer sides of the IC chip or engage tapered side walls defining holes which are formed in the chip by a laser.

An advantage of the alignment means of the present invention is that the raised guide features can be formed at the same time as the contact bumps or features of the circuit traces when they are formed. The circuitry and raised contact features for the substrate or flex member can be formed by using the method as disclosed in U.S. Pat. No. 5,207,887. The same method would be employed as disclosed in the aforementioned patent except that the mandrels would also have a second, deeper set of depressions formed therein for forming tall or raised guide features. Thus, both the raised electrical contacts and guide features can be simultaneously formed.

The present invention further resides in various novel constructions and arrangement of parts, and further objects, novel characteristics and advantages of the present invention will be apparent to those skilled in the art to which it relates and from the following detailed description of the illustrated, preferred embodiment thereof made with reference to the accompanying drawings forming a part of this specification and in which similar reference numerals are employed to designate corresponding parts throughout the several views, and in which.

Figure 1:
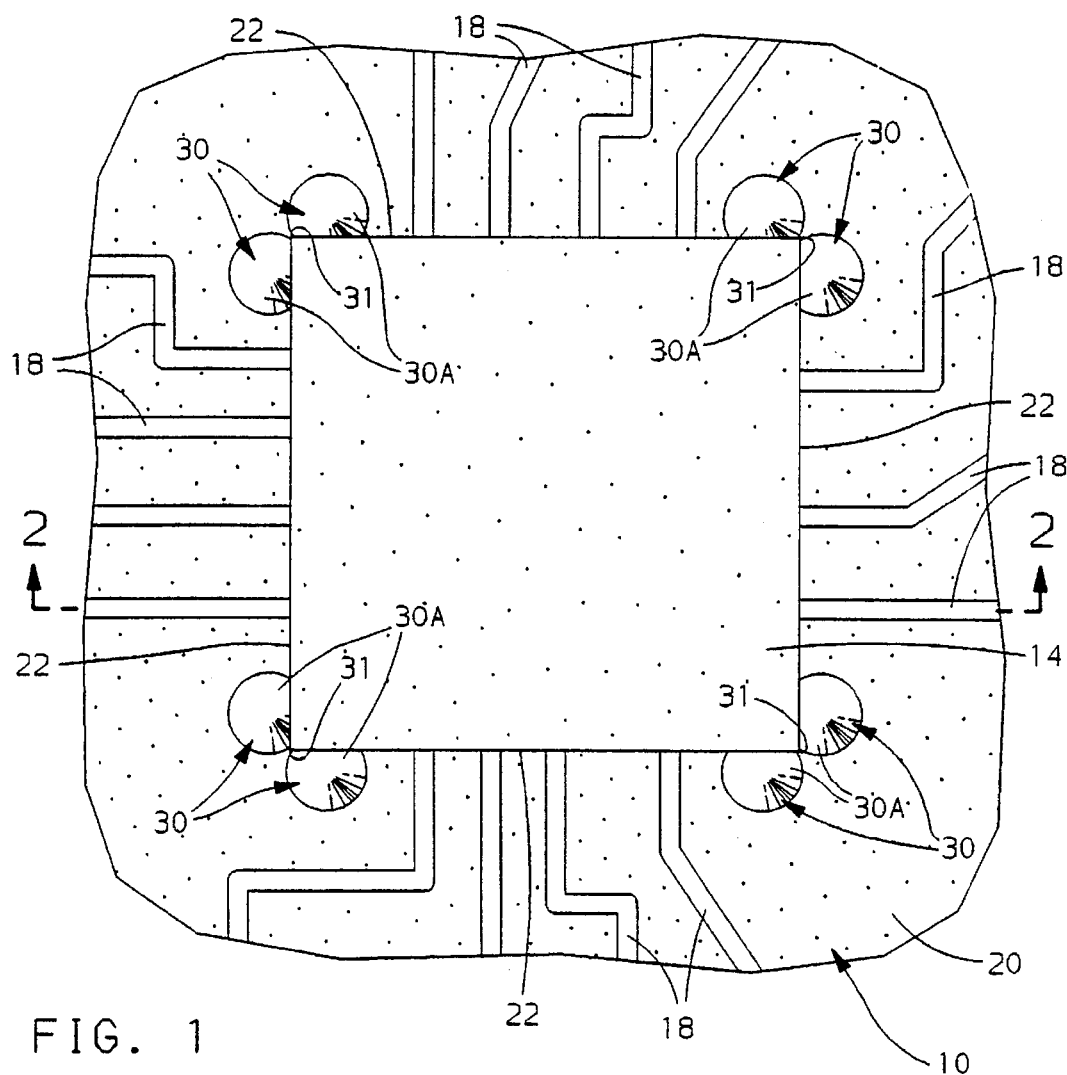
FIG. 1 is a fragmentary top plan view of an integrated circuit chip and showing it mounted to a substrate.
Figure 2:
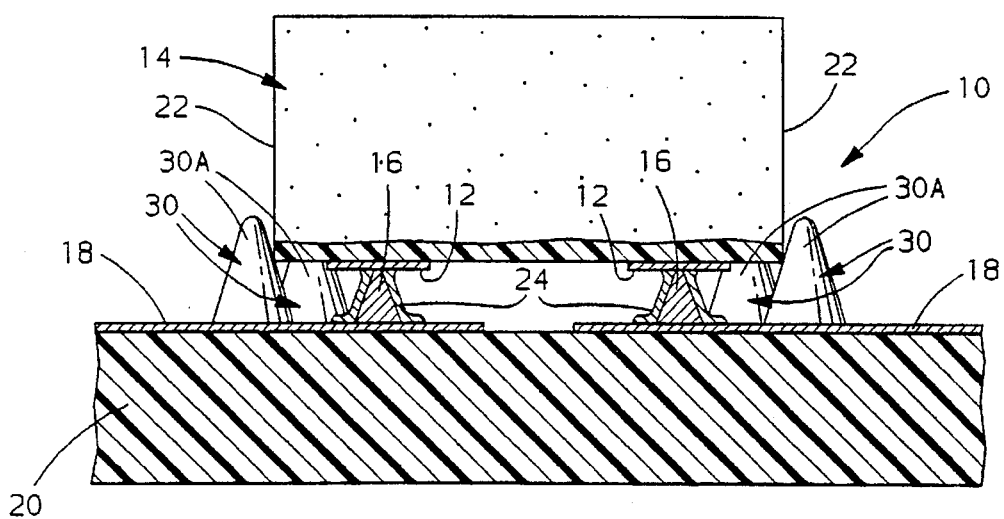
FIG. 2 is a cross sectional view taken approximately along line 2—2 of FIG. 1.

As shown in FIGS. 1 and 2, the present invention provides a novel alignment means 10 for aligning contact pads 12 of a flip integrated circuit (IC) chip 14 to raised electrical contacts 16 at the ends of circuit traces 18 on a substrate 20.

The integrated circuit (IC) chip 14 would be of conventional construction and have a plurality of circuit traces on one side terminating in the contact pads 12. The contact pads 12 on the illustrated IC chip 14 are spaced inwardly from side edges 22 of the IC chip 14.

The substrate 20 would be of a dielectric material and could either be a rigid substrate such as a multi module substrate or could be a flexible substrate. Substrate 20 would have a plurality of the circuit traces 18 formed thereon in any suitable or conventional manner and with the traces terminating in raised contact bumps or features 16 at their ends. The circuit traces 18 and substrate 20 could be made in the manner disclosed in U.S. Pat. No. 5,207,887, which patent is hereby incorporated by reference in this application.

Electro deposited over the raised contacts 16 is a fusible layer 24. The fusible layer 24 is preferably of a tin-lead composition.

In accordance with the provision of the present invention, the novel alignment means 10 guides and aligns or registers the flipped IC chip 14 to the raised contacts 16 so that the pads 12 of the IC chip 14 engage the layer 24 and raised contacts 16 on the substrate 20. The alignment means 10 comprises a plurality of raised features or bumps 30 which are conical in shape. The number of raised features 30 could be varied, but preferably would be six or eight for each IC chip 14. As shown in FIG. 1, eight such raised features 30 are used with the IC chip 14. The raised features 30 would be spaced outside the circuit traces 18 and have their outer sides 30A engage the outer sides 22 of the IC chip 14 adjacent its corners 31. The tapered, conical raised features 30 would engage the sides 22 of the IC chip 14 and guide the same down onto the raised electrical contacts 16. When the IC chip 14 is in engagement with the raised contacts 16, the substrate assembly can be heated to cause the layer 24 to reflow to produce a solder alloy to solder the raised contact bumps 16 to the contact pads 12 of the IC chip 14. Alternately, a suitable electrically conductive Z-axis adhesive could be used to connect the IC chip 14 to the raised contacts 16 on the substrate 20, as disclosed in U.S. Pat. No. 5,245,750, which patent is hereby incorporated by reference in this application.

It should be noted that the raised features 30 are formed at the same time that the raised contact bumps 16 are formed and in accordance with the method disclosed in U.S. Pat. No. 5,207,887. The raised features 30 like the contact bumps can either be solid metal or could be hollow and filled with a solid material by placing a dollop of epoxy in the hollow part.

Figure 3:
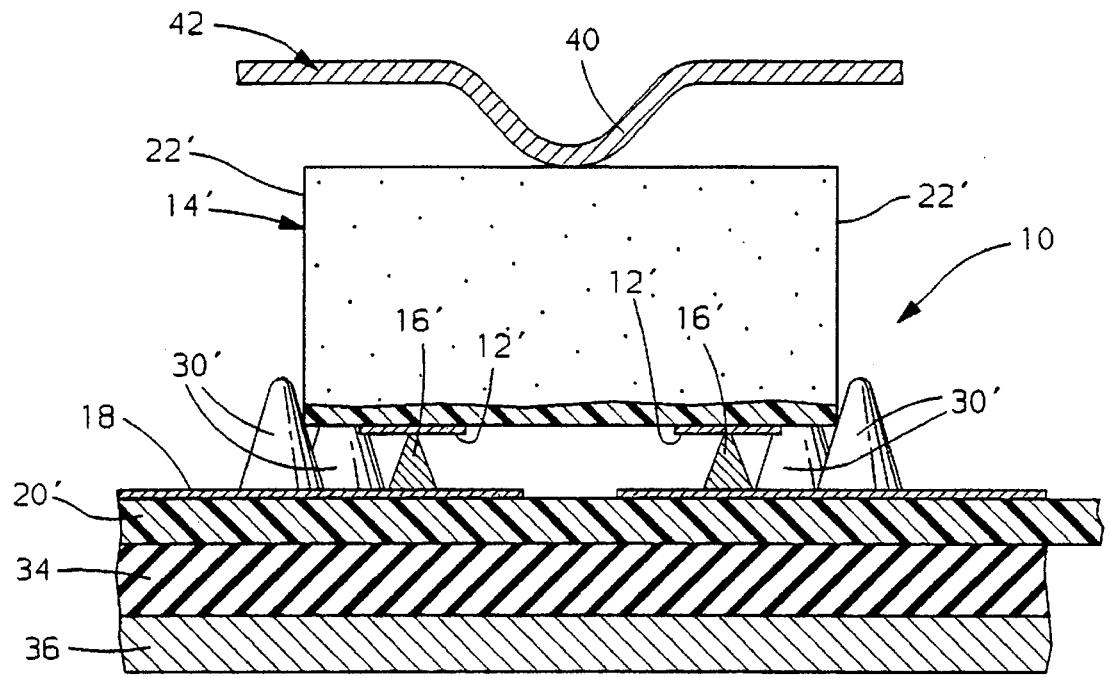
FIG. 3 is an enlarged fragmentary sectional view showing the use of the invention in a burn in test socket application.

FIG. 3 shows fragmentary parts of a burn in socket application for the alignment means 10 of the present invention. In this application, a flexible substrate 20' having raised contact bumps 16' is provided for engaging the circuit pads 12' of an IC chip 14' in a test device or application. The raised features 30' again would engage the outer sides 22' of the IC chip 14'. In a burn in socket application using a flexible substrate 20', an elastomer pad 34 would be placed beneath the raised features 16' and with the elastomer pad 34 being supported by a suitable support 36. In this application, the IC chip 14' would be merely placed onto the contact bumps 16' and then clampingly held in place by a clamp portion 40 of a suitable cover 42 connected to the support 36. Release of the cover 42 would enable the IC chip 14' to be removed from the substrate 20' of the burn in die socket.

Figure 4:
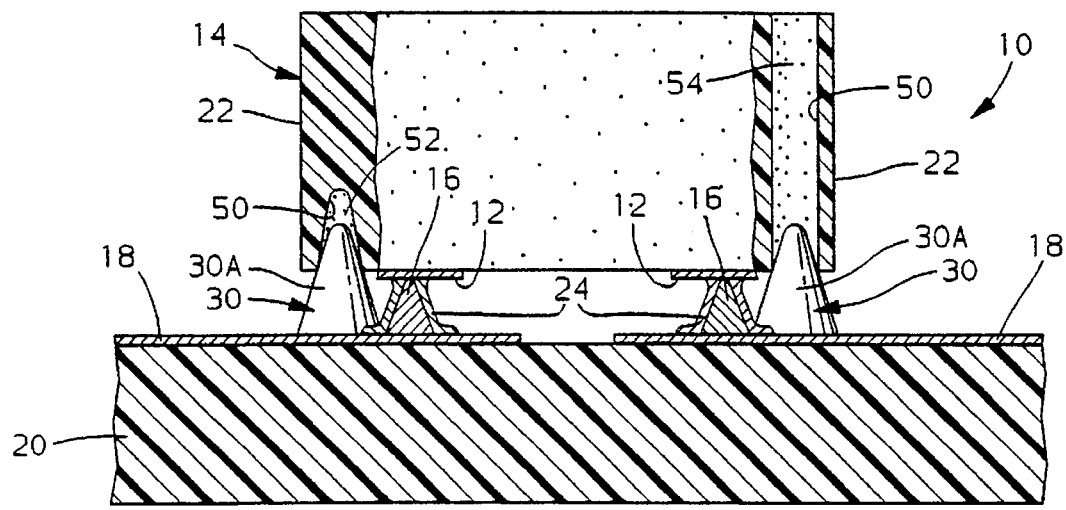
FIG. 4 is an enlarged fragmentary sectional view of a substrate and integrated circuit chip having an alternate alignment means.

FIG. 4 shows an alternate embodiment of the present invention. The FIG. 4 embodiment is identical to the FIGS. 1 and 2 embodiment except that the raised features 30 engage a side wall 50 of vias or holes 52, 54 in the IC chip 14. The same reference numerals will be used for the various parts shown in FIG. 4 which correspond to the parts shown in FIG. 1. The IC chip 14 has a through via or hole 54 adjacent one of its corners 31. A Yag laser is used to provide partial or blind vias or holes 52 adjacent the other corners of the IC chip 14. The side walls 50 of the blind vias 52 are tapered to define a conically shaped via 52 which matches the conically shaped raised features 30. The number of blind vias 52 and through vias 54 provided in the IC chip 14 could be varied, but at least four would be provided adjacent the four corners of the IC chip 14. The through via 54 is used to align the IC chip 14 to one of the raised features 30. As can be seen, the conical raised features 30, when the IC chip 14 is placed thereover and aligned therewith, will guide the IC chip 14 into place and with the contact ends 12 engaging the layer 24 and raised contacts 16. When the contact pads 12 of the IC chip 14 are in engagement with the layer 24 and raised contacts 16, the IC chip 14 can be soldered to the raised electrical contacts 16 by heating the assembly and reflowing the layer 24. Alternately, the contacts could be adhesively secured to the pads 12 with a Z-axis electrically conductive adhesive.

From the foregoing, it should be readily apparent that a very simple and economical alignment means 16 has been provided for aligning an IC chip to raised contact bumps 16, 16' on a substrate. It should also be apparent that the raised alignment features 30 can be formed on the substrate 20, 20' at the same time as the raised contact bumps 16 so that no additional processing steps are required to form the alignment means 10.

Although the illustrated embodiment hereof has been described in great detail, it should be apparent that certain modifications, changes and adaptations may be made in the illustrated embodiment, and that it is intended to cover all such modifications, changes and adaptations which come within the spirit of the present invention.

We claim:

1. In combination, a flexible circuit having a layer of flexible material and having a plurality of first raised bumps formed by said flexible material and a plurality of second raised bumps formed of said flexible material, and a first plurality of circuit traces having circuit ends which terminate on said first raised bumps and which are arrayed in a first pattern, an integrated circuit chip having a second plurality of circuit traces terminating in contact ends which are arrayed in a second pattern identical to that of the first pattern, said contact ends of said integrated circuit chip being in engagement with said circuit end on said first raised bumps, wherein said plurality of second raised bumps comprise a metal having a hollow portion and are higher than said first raised bumps and spaced from said first raised bumps, said second bumps having tapered side surfaces for engaging vertically extending surfaces on said chip so that said chip is guided into place on said substrate and so that its contact ends are aligned with the first raised bumps on said substrate.

2. The combination of claim 1 wherein the hollow portion is filled with a solid material.

3. In combination, a flexible circuit having a layer of flexible material and having a plurality of first raised bumps formed by said flexible material and a plurality of second raised bumps formed of said flexible material, and a first plurality of circuit traces having circuit ends which terminate on said first raised bumps and which are arrayed in a first pattern, an integrated circuit chip having a second plurality of circuit traces terminating in contact ends which are arrayed in a second pattern identical to that of the first pattern, said contact ends of said integrated circuit chip being in engagement with circuit ends on said first raised bumps, wherein said plurality of second raised bumps comprise a metal and are higher than said first raised bumps and spaced from said first raised bumps, said integrated circuit chip having a plurality of blind vias extending upwardly from an underside of the chip and which are defined by a side surface, said second bumps having tapered side surfaces for engaging said side surface so that said chip is guided into place on said substrate and so that its contact ends are aligned with the first raised bumps on said substrate.

4. The combination as defined in claim 3 and wherein the second raised bumps are conically shaped and have diameters which progressively decrease proceeding from said substrate to their free ends.

* * * * *